Feb. 20, 1962 J. A. PIETSCH 3,022,360
THERMOELECTRIC ASSEMBLY
Filed Nov. 25, 1960
FIG. 1
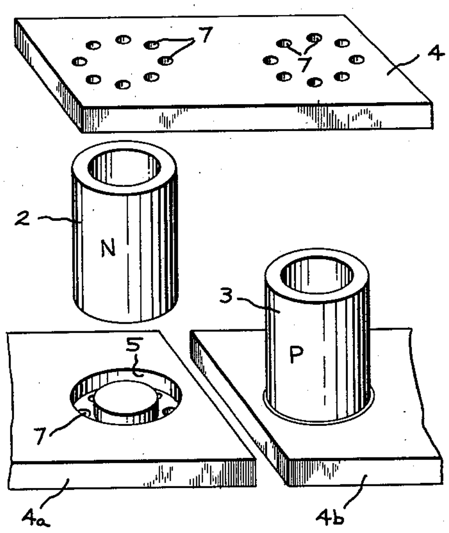
FIG. 4
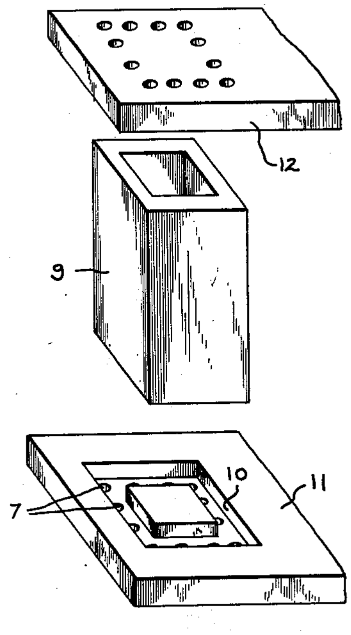
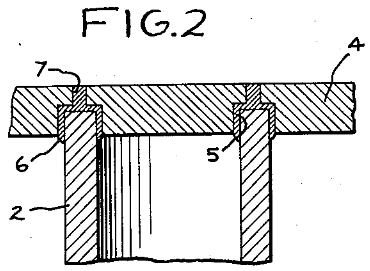
FIG. 5
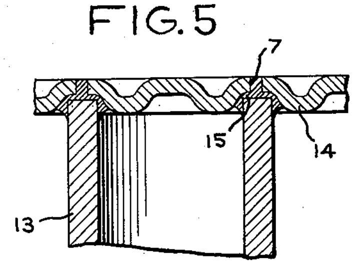
FIG. 3
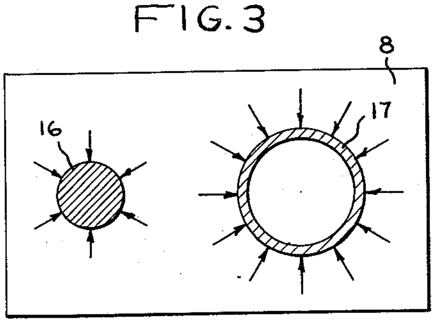
INVENTOR.
JOSEPH A. PIETSCH
BY [signature]
HIS ATTORNEY United States Patent Office 3,022,360

Patented Feb. 20, 1962

3,022,360
THERMOELECTRIC ASSEMBLY

Joseph A. Pietsch, Louisville, Ky., assignor to General Electric Company, a corporation of New York Filed Nov. 25, 1960, Ser. No. 71,567
4 Claims. (Cl. 136—4)

The present invention relates to thermoelectric assemblies of the type used in heating and cooling devices and more particularly to an improved structural arrangement for thermoelectric members and their associated conductors.

When two materials of dissimilar thermoelectric properties are joined and a direct current is passed therethrough, the junction becomes either hot or cold depending upon the direction of the electrical current flowing through the junction. This phenomenon is known as the Peltier effect and exists in all junctions of dissimilar materials to some extent. Some materials or alloys, due to a combination of thermal and electrical properties, produce an effect that is many times the magnitude of others and these materials or alloys are called thermoelectric materials. For example, thermal junctions, formed between certain alloys of lead, bismuth, or antimony combined in varying quantities with tellurium or selenium and having slight amounts of impurities, such as silver, gold or sulfur, have exhibited heating and cooling properties of a magnitude that can be usefully applied to the fields of air conditioning and refrigeration.

A thermoelectric heating or cooling device, in its simplest form, comprises a source of D.C. power which forces a current through a series of junctions of dissimilar thermoelectric materials. The thermal junctions either absorb heat or generate heat and are, therefore, segregated so that all like junctions are arranged in the same ambient. The cold junctions then produce a cooling effect in one ambient, while the hot junctions dissipate heat to another ambient. The thermal junctions of the device are usually formed by soldering two blocks or rods of dissimilar thermoelectric materials to a conductor link. The conductor link not only conducts the electrical current to the respective thermoelectric members but also acts as a heat exchange surface to aid the transfer of heat to and from the thermal junctions. It is desirable, therefore to design the thermal junctions so that heat may be conducted toward or away from the respective junction as rapidly as possible.

Accordingly, it is an object of the present invention to provide an improved structure for a thermal junction of a thermoelectric heating and cooling device.

It is an other object of the present invention to provide a thermal junction between a connector link and a thermoelectric member having improved heat dissipation and absorption characteristics.

Further objects and advantages of the invention will become apparent as the following description proceeds and the features of novelty which characterize the invention will be pointed out with particularity in the claims annexed to and forming a part of this specification.

In carrying out the present invention there is provided a thermoelectric junction formed of a tubular-shaped thermoelectric element and a conductor link having a mating groove adapted to receive the end of the thermoelectric element. The end of the thermoelectric element is soldered into place within the groove in the conductor link by means of a solder material having high electrical conductivity and good heat transfer properties. The shape of the thermal junction, which provides a large peripheral length of contact between the thermoelectric member and the conductor link, greatly increases the thermal flow in the conductor link toward or away from the junction.

For a better understanding of the invention, reference may be had to the accompanying drawing in which:

FIG. 1 is an exploded view (greatly enlarged) taken in perspective showing some of the components of a thermoelectric junction in their related positions prior to assembly into a series connected thermocouple;

FIG. 2 is a cross-sectional view of the junction between a cast or machined conductor link and a tubular thermoelectric element;

FIG. 3 is a view of the cross sections of a solid element and a tubular element illustrating the heat flow paths to the respective elements;

FIG. 4 is a perspective view of a thermoelectric junction embodying a tubular thermoelectric element that is rectangular in cross section rather than round; and FIG. 5 is a cross-sectional view similar to that of FIG. 2 in which the conductor link is formed from sheet stock instead of being cast.

Referring now to FIG. 1 of the drawing, there is shown the components of the thermoelectric junction of the present invention arranged in their preassembly positions. Generally speaking a thermoelectric heating or cooling device comprises an array of thermal junctions of series connected elements having dissimilar thermoelectric properties. The thermoelectric elements 2 and 3 are designated either N or P. The N and P nomenclature is prevalent in the semi-conductor terminology at present and is used herein for convenience in differentiating materials having dissimilar thermoelectric properties. An N material includes an abundance of electrons. A P material includes an abundance of electron vacancies or holes. A thermocouple is formed of an element 2 of N type material joined to an element 3 of P type material. In most heating and cooling devices and in the embodiment shown in FIG. 1, the N and P type elements are connected in series through means of suitable links or bars, 4, **4*a* and 4*b*, of thermally and electrically conductive material, such as copper. When the thermocouple is assembled and a direct current is passed through the thermocouple in the positive direction, i.e. from N to P, the junction between the N and P material, becomes cold. Thus, the copper link 4, becomes cold when a direct current is passed through the assembly in the direction of the N to P elements. Conversely, when a direct current is passed through the thermocouple in the opposite direction, i.e. from P to N, the junction then becomes hot. Thus, the copper link 4** becomes hot when a direct current is passed through the assembly in the direction of the P to N elements.

In the thermal junctions of the present invention the thermoelectric elements or members 2 and 3 are made tubular in shape so that their cross-sectional perimeter is as great as possible for the total amount of thermoelectric material in the element. That is, for a given quantity of thermoelectric material, a tubular shape provides greater structural strength and a much greater perimeter than is provided by the solid bar or block structure of the elements presently used in thermoelectric heating and cooling devices.

The conductor links 4, **4*a* and 4*b* are provided with grooves or recesses 5 adapted to receive the open ends of the thermoelectric elements 2 and 3. As may be seen in FIG. 2, the end of the element 2** extends into the groove 5 and is retained therein by a solder or brazing material 6 having good thermal and electrical conductive properties, such as silver solder. In order to reduce, as much as possible, the entrapment of gases within the cavity or groove 5 during the soldering or brazing operation, a plurality of gas escape holes 7 are provided in the conductor line each communicating with the grooves 5 in the link. Solder or brazing material may be poured or placed into the groove or recess 5 and the end of the thermoelectric element inserted therein.

The tubular shaped thermoelectric element, when soldered into the groove or recess of the conductor link, provides an exceedingly strong structural member. The solder material and the opposite sides of the groove 5, which encompass the inner and outer surfaces of the end of the thermoelectric element, and support the element around the inner and outer circumferences thereof. The tubular shape also provides a very large bonding area for the solder or brazing material as compared to that provided around the circumference of a solid thermoelectric element formed of the same quantity of thermoelectric material.

A further very important advantage in utilizing a tubular thermoelectric element over a solid element is that a much greater area is available at the junction of the tubular element and the conductor link for the flow of heat in the conductor link toward or away from a tubular thermoelectric element. This may be better understood by reference to the cross sectional view of the thermoelectric elements 16 and 17 of FIG. 3. Although each of the elements 16 and 17 have equal cross sectional areas and thus comprise the same quantity of thermoelectric material for an equal length of the element, the total perimeter of the tubular element 17 is obviously much greater than that of the solid element 16. As illustrated by the arrows in the conductor link 8 representing the heat flow of FIG. 3, the greater edge perimeter of the tubular shaped element 17 greatly enlarges the path whereby heat may flow toward the element. Inasmuch as most of the heat dissipated or absorbed by the element in heating or cooling devices is transmitted to the element through the conductor link, it is very desirable to increase the heat conductive path adjacent the element.

It should be mentioned that a tubular shaped element is not limited merely to a circular or cylindrical shaped element. As may be seen in FIG. 4, the tubular element 9 has a rectangular periphery as well as a rectangular opening therethrough. The rectangular tube is, of course, inserted into rectangular shaped grooves or recesses 10 in its associated conductor links 11 and 12. It is obvious that a rectangular shaped tubular element, such as element 9, provides a greater outer peripheral length than a solid block element having the same quantity of thermoelectric material. This, greatly enlarges the heat flow path to the element in the conductor link and, thus, enhances the heat transfer characteristics of the structure.

Referring now to FIG. 5 there is shown a cross-section of a junction between a tubular shaped element 13 and a conductor link 14 in which the recess or groove 15 has been formed from a sheet of strip stock which has been stamped or pressed into shape. For mass production manufacture of heating or cooling devices containing junctions of this type, it would probably be desirable to form the conductor link in this manner from malleable strips of stock, such as copper or other good heat and electrical conductor material.

By the present invention there has been provided a thermal junction between a thermoelectric element and its associated conductor link that not only provides outstanding physical strength but also enhances the heat transferability between the thermoelectric element and the conductor link.

While in accordance with the patent statutes there has been described what at present is considered to be the preferred embodiments of the invention, it will be understood by those skilled in the art that various changes and modifications may be made therein without departing from the invention, and it is, therefore, the aim of the appended claims to cover all such changes and modifications as fall within the true spirit and scope of the invention.

What I claim as new and desire to secure by Letters Patent of the United States is:

1. A thermoelectric junction for a heating or cooling device utilizing the Peltier effect comprising a tubular shaped thermoelectric element having at least one open end, an electrical current and thermal conductor link having an annular groove adapted to receive said open end of said tubular shaped thermoelectric element with the sides of said annular groove encompassing the inner and outer surface of said end of said tubular-shaped thermoelectric element, and solder means of high electrical and heat conductivity in said annular groove around the inner and outer surface of said end of said tubular-shaped thermoelectric element for securing said open end of said thermoelectric element within said groove in said conductor link.

2. A thermoelectric junction for a heating and cooling device utilizing the Peltier effect comprising a tubular shaped thermoelectric element having at least one open end, an electrical current and thermal conductor link having an annular groove adapted to receive said open end of said tubular shaped element with the sides of said annular groove encompassing the inner and outer surfaces of said open end of said thermoelectric element, a plurality of gas escape holes extending through said conductor link and communicating with said annular groove, and solder means in said annular groove around the inner and outer surfaces of said open end for retaining said open end of said tubular thermoelectric element in said annular groove of said conductor link, said solder means being of a type having good electrical and heat conducting properties.

3. A thermoelectric junction for a heating and cooling device utilizing the Peltier effect comprising a thermoelectric element of tubular-shape and having at least one open end, said element being of rectangular cross-section with inner and outer rectangular surfaces, an electrical current and thermal conductor link having a rectangular groove therein adapted to receive said open end of said tubular-shaped thermoelectric element with the sides of said annular groove encompassing the inner and outer end surfaces of said thermoelectric element, said tubular shaped thermoelectric element having said open end thereof soldered into said groove of said conductor link thereby to provide a thermal junction with said conductor link having great structural strength and having relatively great peripheral length as compared to the length of junction that would be provided by a solid element of equal length and cross-sectional area formed of the same amount of thermoelectric material.

4. A thermoelectric junction for a heating and cooling device utilizing the Peltier effect comprising a thermoelectric element of tubular-shape having at least one open end, an electrical current and thermal conductor link having a groove therein shaped substantially the same as the cross-section of said end of said tubular-shaped thermoelectric element, said conductor link adapted to receive said open end of said tubular-shaped thermoelectric element with the sides of said groove encompassing the inner and outer surfaces of said end of said tubular-shaped thermoelectric element, and solder means of high electrical and heat conductivity in said groove between the sides thereof and the inner and outer surfaces of said thermoelectric element for securing said open end of said thermoelectric element within said groove thereby to provide a thermal junction between said conductor link and said thermoelectrical element having great structural strength and having relatively great peripheral length as compared with the length of the junction that would be provided by a solid element of equal length and cross sectional area formed of the same amount of thermoelectric material.

References Cited in the file of this patent

UNITED STATES PATENTS

| | | |
|---|---|---|
| 383,464 | Gulcher | May 29, 1888 |
| 2,779,172 | Lindenblad | Jan. 29, 1957 |
| 2,946,835 | Westbrook et al. | July 26, 1960 |